United States Patent [19]

Yamamoto

[11] Patent Number: 4,585,952
[45] Date of Patent: Apr. 29, 1986

[54] DIGITAL WAVEFORM SHAPING CIRCUIT

[75] Inventor: Takaaki Yamamoto, Tokyo, Japan

[73] Assignee: Sansui Electric Co., Ltd., Tokyo, Japan

[21] Appl. No.: 472,326

[22] Filed: Mar. 4, 1983

[30] Foreign Application Priority Data

Mar. 4, 1982 [JP] Japan .................................. 57-34482
May 10, 1982 [JP] Japan .................................. 57-76541

[51] Int. Cl.[4] .............................................. H03K 5/01
[52] U.S. Cl. .................................... 307/268; 307/359; 328/164
[58] Field of Search ............... 307/268, 358, 359, 360, 307/361, 494, 605; 328/146, 147, 150, 151, 164; 360/36.2, 38.1, 39, 46, 65; 375/99, 104; 382/57

[56] References Cited

U.S. PATENT DOCUMENTS

| | | | |
|---|---|---|---|
| 3,916,327 | 10/1975 | Lampen et al. | 307/360 X |
| 3,955,191 | 5/1976 | Lambourn | 307/359 X |
| 4,064,408 | 12/1977 | Hon et al. | 328/150 X |
| 4,425,548 | 1/1984 | Kage | 307/359 X |
| 4,449,061 | 5/1984 | Yasuda et al. | 307/268 |

FOREIGN PATENT DOCUMENTS

| | | | |
|---|---|---|---|
| 0047955 | 3/1982 | European Pat. Off. | 307/603 |
| 0131324 | 6/1978 | German Democratic Rep. | 307/359 |

OTHER PUBLICATIONS

Rackl, W. K., "Dynamic Threshold Circuit", IBM Technical Disclosure Bulletin, vol. 15, No. 4 (Sep. 72), pp. 1138-1139.

Primary Examiner—Eugene R. LaRoche
Assistant Examiner—Robert J. Pascal
Attorney, Agent, or Firm—Sughrue, Mion, Zinn, Macpeak & Seas

[57] ABSTRACT

The present invention provides a digital signal waveform shaping circuit for reproducing a digital signal recorded on a recording medium. The waveform shaping circuit includes at least one comparator for receiving an input signal and a delay circuit connected to the output of the comparator for delaying the comparator output by one-bit-cell. The input signal is compared with a threshold level associated with the output of the delay circuit.

10 Claims, 43 Drawing Figures

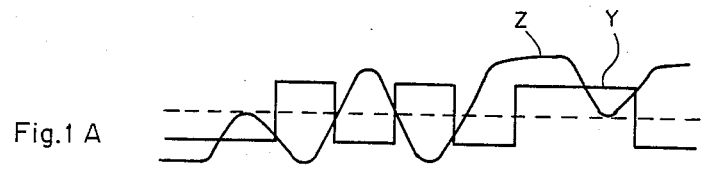
Fig.1A
Fig.1B
Fig.1C
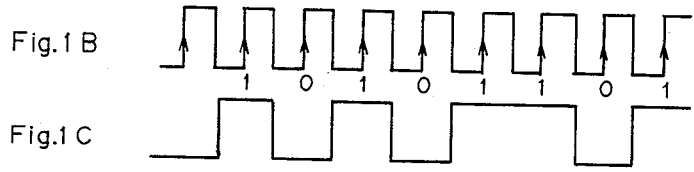
Fig.1D
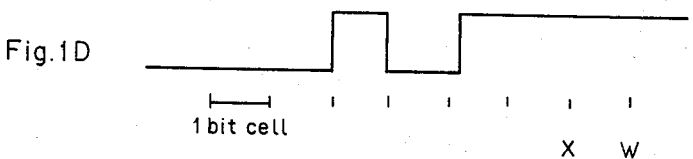
Fig.1E
Fig.1F
Fig.1G

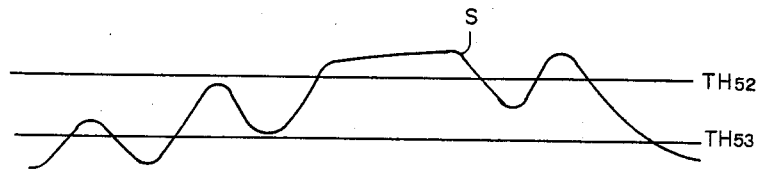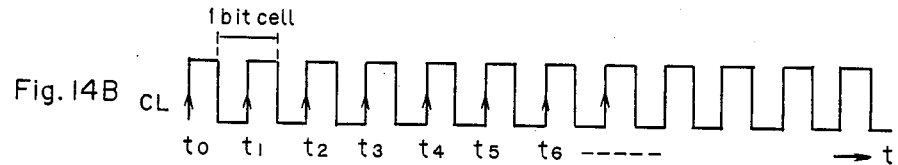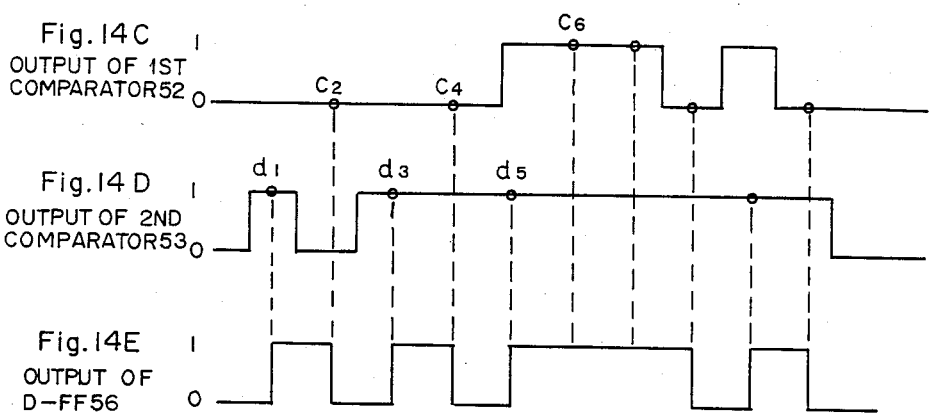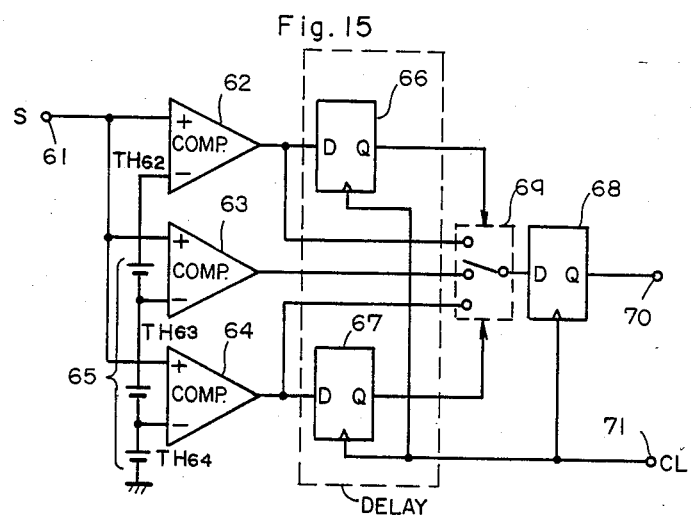

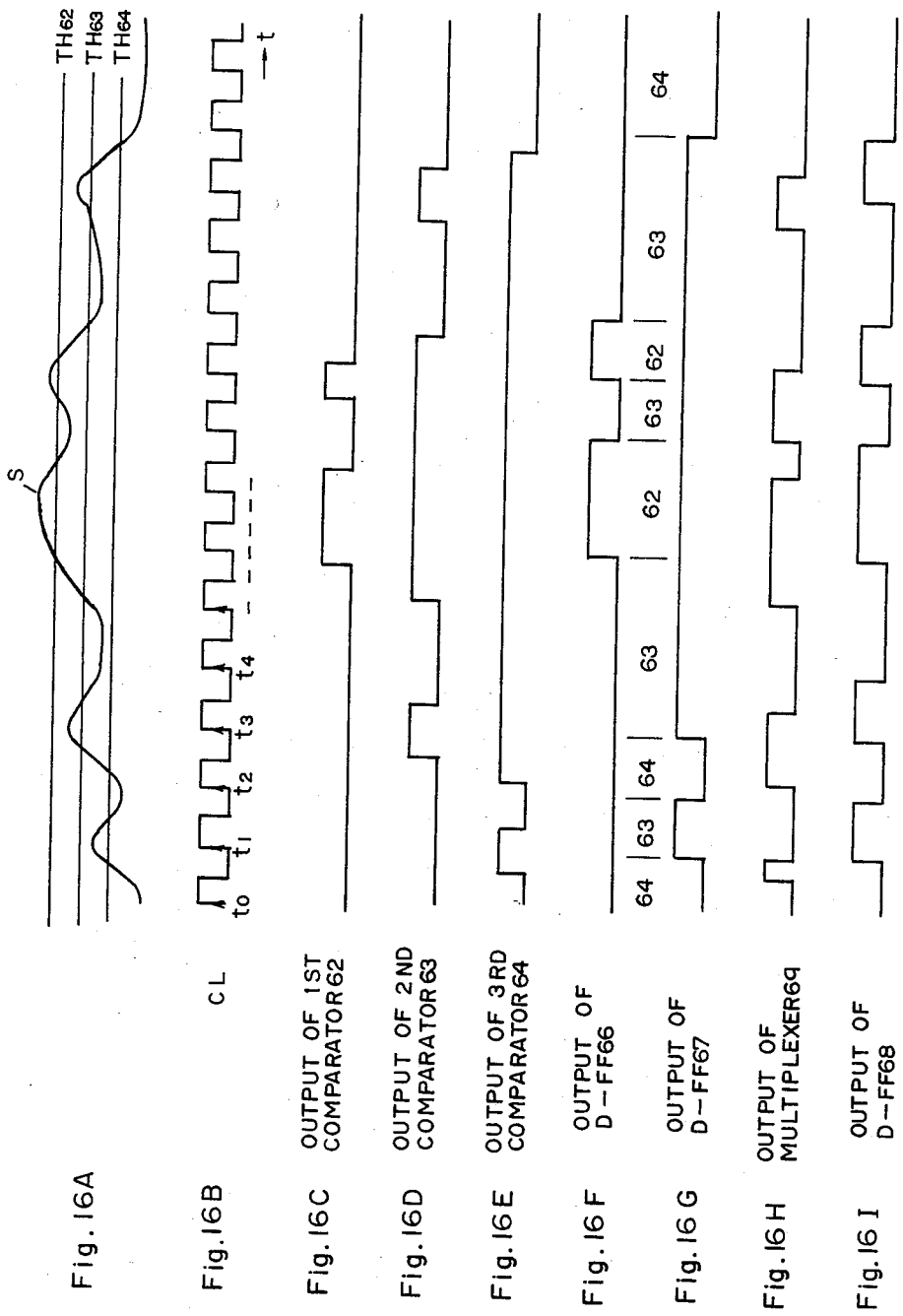

DIGITAL WAVEFORM SHAPING CIRCUIT

BACKGROUND OF THE INVENTION

The present invention relates to a digital waveform shaping circuit capable of accurately reconstructing a deteriorated digital signal.

Digital signals are recorded in high density and reproduced with PCM (pulse-code modulation) recorders or the like. In this case, because of intersymbol interference between recording bit patterns, the quality of reproduced signals is poor and their demodulation difficult. This problem is especially common in recording-reproducing systems using magnetic tape and heads, and having a narrow range.

With commercially available PCM encoders-decoders, for example, audio signals are recorded and reproduced by the PCM system, using a commercially available video cassette system. A television synchronizing-signal is recorded between PCM audio signals so that the PCM audio signals before and after the synchro-signal are subjected to the intersymbol interference, deteriorating their properties. Particularly, the recording density of the commercially available video cassette system has been made high, which makes it difficult to arrange the recording-reproducing range sufficiently wide. This makes it difficult to correctly demodulate the system signals. When a threshold level is conventionally held constant at a comparator at the time of reproducing and wave-shaping digital signals recorded on a recording medium, the recorded signal waveform peak may be too low to reach the threshold level.

Referring to the waveforms shown in FIGS. 1A to 1D, a signal to be demodulated as the signal shown in FIG. 1C is incorrectly demodulated as the signal shown in FIG. 1D when a deteriorated analog signal Z synchronized to the synchronizing signal shown in FIG. 1B is detected at the rise of its synchronizing signal, while the threshold level is held fixed at the position shown by the broken line in FIG. 1A.

SUMMARY OF THE INVENTION

The present invention is intended, therefore, to eliminate the above-mentioned drawbacks.

An object of the present invention is to provide a digital signal waveform shaping circuit in which a present input signal is compared with a threshold level signal associated with a demodulated past signal, thereby reproducing a correct demodulated digital signal, even if the present input signal has deteriorated.

Another object of the present invention is to provide a digital signal waveform shaping circuit wherein even a deteriorated signal can be accurately demodulated by changing the threshold level according to past demodulated data.

Another object of the present invention is to provide a digital signal demodulator circuit wherein an input signal is applied to a plurality of comparators whose threshold levels are different from one another, and compared with these threshold levels, respectively, and that one of the outputs of said plural comparators is selected according to the bit condition of a preceded bit, so as to demodulate the correct digital value of every bit.

BRIEF DESCRIPTION OF DRAWINGS

FIGS. 1A to 1G are waveform diagrams showing a demodulation of a digital signal.

FIGS. 14A to 14E are waveform diagrams by which the operation of the embodiment shown in FIG. 13 is explained.

FIG. 15 is a block diagram of a further embodiment of the present invention.

FIGS. 16A to 16I are waveform diagrams by which the operation of the embodiment shown in FIG. 15 is explained.

DETAILED DESCRIPTION OF PREFERRED EMBODIMENTS

Figure 2:
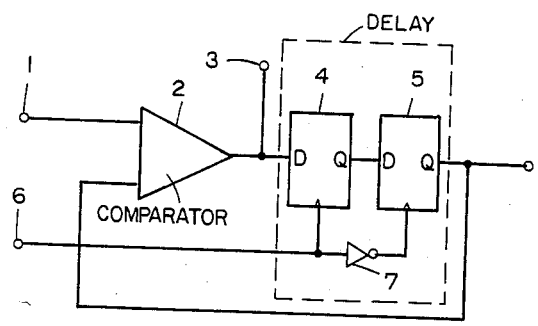
FIG. 2 is a block diagram showing an embodiment of the present invention.

An embodiment of the present invention will be described in detail referring to the block diagram shown in FIG. 2. Numeral 1 represents an input terminal to which an input signal to be shaped is applied, and 2 a comparator to which the input signal is applied through the input terminal 1. A digital signal appearing at the output of the comparator 2 is outputted as a demodulated wave shaped signal through an output terminal 3 and also applied to a data input D of a first D-type flip-flop 4 (which will be hereinafter referred to as first D-FF). An output Q of this first D-FF 4 is applied to a data input D of a second D-FF 5, whose output Q is fed back to a threshold level input of the comparator 2. Numeral 6 represents a synchronizing input terminal to which a synchronizing signal extracted from the input signal by means of, for example, a PLL circuit not shown and having a cycle corresponding to one bit cell is applied. This synchronizing-signal is applied directly to a clock input of the first D-FF 4 but through an inverter 7 to a clock input of the second D-FF 5.

When arranged as described above, the output of the comparator 2 is latched to the first D-FF 4 at the rise of the synchronizing-signal and to the second D-FF at the fall of the synchronizing signal. Therefore, the output of the second D-FF 5 is applied to the threshold level input of the comparator 2. Thus, the threshold level of the comparator 2 is controlled by the level of the output data in the preceding bit-cell. Accordingly, the threshold level of the comparator 2 is set every 1-bit-cell, as shown by Y in FIG. 1A, for demodulating an input signal shown by Z in FIG. 1A, thus allowing its output to be accurately demodulated to its original and correct signal as shown in FIG. 1C.

The synchronizing-signal synchronizes accurately with each bit cell so that even deteriorated signals and signals shifted in time can be accurately demodulated.

In the case where the input signal is delayed in time as shown by X in FIG. 1E, for example, waveform shaping at a fixed threshold level causes time delayed output signal as shown in FIG. 1F. When the signal is detected at the rise of the synchronizing-signal shown in FIG. 1B, error is likely to occur. However, when the threshold level is controlled in accordance with the level of the preceding cell as shown by W in FIG. 1E, the waveform-shaped signal is relatively accurately demodulated as shown in FIG. 1G. The signal picked up at the rise of the synchronizing-signal thus allows correct original data to be demodulated.

It should be understood that the present invention is not limited to the above-described embodiment. When the range of recording-reproducing system is so extremely narrow relative to signals to cause these signals to be severely deteriorated data preceding more than 2-bit-cells may be used to determine the threshold level.

Figure 3:
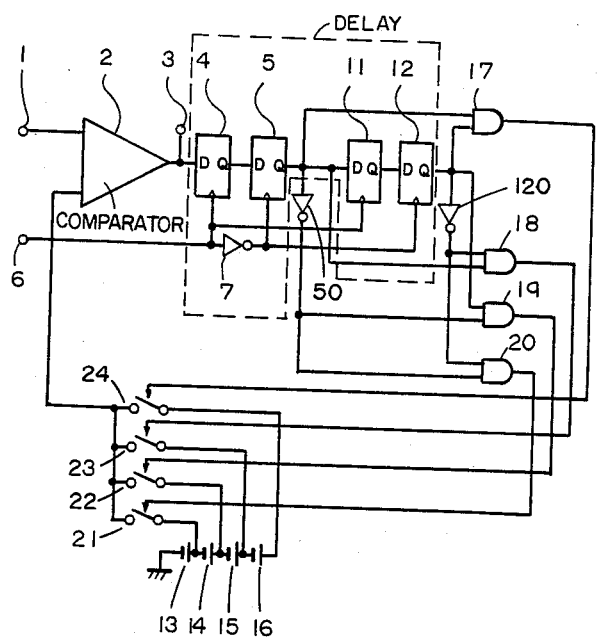
FIG. 3 is a block diagram showing another embodiment of the present invention.

FIG. 3 is a block diagram showing a circuit in which the data in the two preceding bit-cells are used to determine the threshold level. The parts in FIGS. 2 and 3 are represented by the same reference numerals and their descriptions are from the explanation of FIG. 3.

Numeral 11 denotes a third D-FF to which the output of the second D-FF 5 is applied, and 12 a fourth D-FF to which the output of the third D-FF 11 is applied. The threshold level is determined depending upon the content of the preceding bit-cell which is seen as the output of the second D-FF 5, and the content of the bit cell preceding the present bit cell by two bit cells and which is seen as the output of the fourth D-FF 12. Different voltages V1, V2, V3 and V4 obtained through four power sources 13, 14, 15 and 16 connected in series with one another are selectively applied to the threshold level input of the comparator 2 by selectively closing switches 21, 22, 23 and 24 using outputs of an operational circuit which comprises gates 17, 18, 19 and 20.

When outputs of flip-flops 5 and 12 are 0 and 0, that is, when the immediately preceding data is 0, and the data preceding the immediately preceding data is 0 the output of the AND circuit 20 becomes 1 and the switch 21 is turned ON, to that the output of the power source 13 corresponding to the lowest voltage $V_1$ is fed back to the threshold input of the comparator 2. When the output of the flip-flop 12 is 1 and that of the flip-flop 5 is 0, the output of the AND circuit 19 becomes 1, and the added voltages of power sources 13 and 14, i.e. the higher voltage $V_2$ becomes the threshold voltage. Similarly, when the output of the flip-flop 12 is 0 and that of the flip-flop 5 is 1, the output of the AND circuit 18 becomes 1 and the switch 23 is turned ON, so that the voltage $V_3$ produced by power sources 13, 14 and 15 becomes the threhold voltage. When the output of the flip-flop 12 is 1 and that of the flip-flop 5 is 1, the output of the AND circuit 17 becomes 1 and the switch 24 is turned ON, thus allowing the highest series voltage $V_4$ produced by power sources 13, 14, 15 and 16 to become a threshold voltage. Since two outputs of flip-flops 5 and 12 are decoded to four outputs by means of inverters 50, 120 and AND circuits 17, 18, 19, 20, these inverters 50, 120 and AND circuits 17-20 form a decoder circuit. Therefore, the threshold level is controlled as shown in the following table, corresponding to the contents of preceding data.

TABLE 1

| Data in second preceding bit cell | 0 | 1 | 0 | 1 |
|---|---|---|---|---|
| Data in first preceding bit cell | 0 | 0 | 1 | 1 |
| Threshold levels | V1 | <V2 | <V3 | <V4 |

Figure 4:
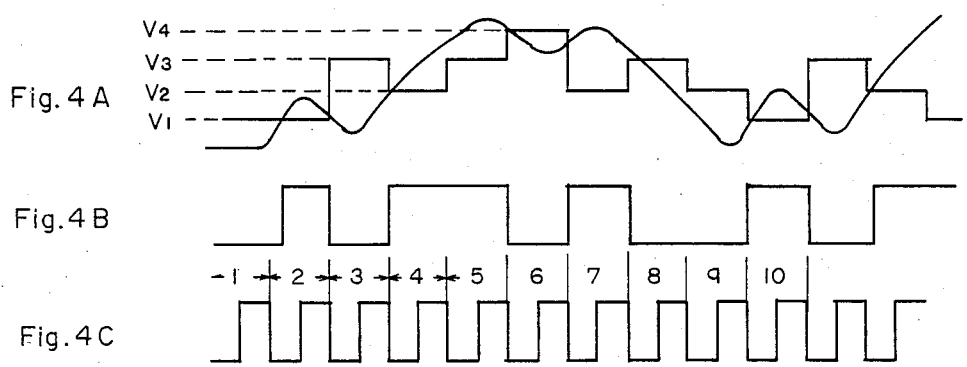
FIGS. 4A to 4C are waveform diagrams by which the operation of the embodiment shown in FIG. 3 is explained.

When arranged like this, a relatively accurate signal can be obtained as shown in FIG. 4B even in the case of a severely deteriorated signal as shown in FIG. 4A, because it is waveform-shaped with different threshold levels V1–V4 determined by the contents of the two preceding bit-cells.

The threshold voltage for correctly demodulating the signal of FIG. 4B from a deteriorated signal is any of voltages $V_1$, $V_2$, $V_3$ and $V_4$. Referring to FIGS. 4A and 4C, when the first bit cell is 0 and the second bit cell is 1 in the process of demodulating a signal, $V_3$ is selected as a threshold voltage in the third bit cell. When the second bit cell is 1 and the third bit cell is 0, $V_2$ becomes the threshold voltage in the fourth bit cell. When fourth and fifth bit cells are 1, respectively, $V_4$ is selected as a threshold voltage in the sixth bit cell. Since eighth and ninth bit cells are 0, respectively, $V_1$ is selected as the threshold in the tenth bit cell. If the deteriorated input voltage is larger than the threshold voltage which varies as described above, it is outputted as a logic "1", but if smaller, it is outputted as a logic "0". Therefore, when the signal thus obtained is synchronized with a synchronizing signal shown in FIG. 4C, the original signal can be accurately demodulated. FIG. 3 shows the case where a 2-bit-cell delay is achieved. Using a delay circuit through which n-bit-cells are delayed, so as to cause its outputs to control $2^n$ units of switches through an n-bit decoder, it is possible to set $2^n$ threshold levels.

Figure 5:
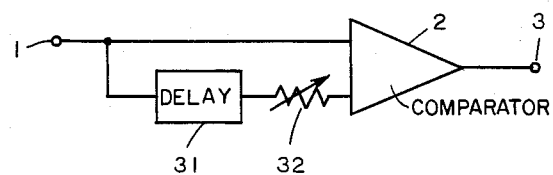
FIG. 5 is a block diagram showing a further embodiment of the present invention.

A delay circuit may also be used to obtain preceding data, as shown in FIG. 5.

The signal applied to the input terminal 1 is applied to the comparator 2, while it is delayed 1-bit-cell by means of a delay circuit 31 and adjusted in level by means of a variable resistor 32 and then applied to the threshold input of the comparator 2. The digital signal waveshaped through the comparator 2 is outputted through the output terminal.

Figure 6:
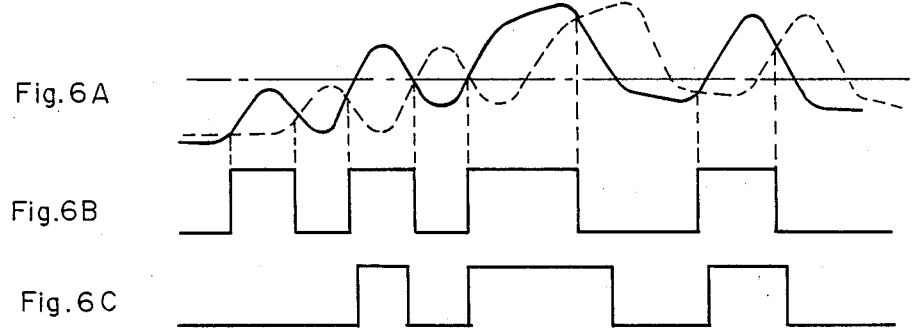
FIGS. 6A to 6C are waveform diagrams by which the operation of the embodiment shown in FIG. 5 is explained.

When processed like this, the threshold level changes as shown by the broken line in FIG. 6A even in the case of an input signal shown by the solid line in FIG. 6A. The signal thus wave-shaped allows its original accurate signal to be demodulated, as shown in FIG. 6B, but the signal detected at a fixed threshold level as shown in FIG. 6C is erroneously detected.

Figure 7:
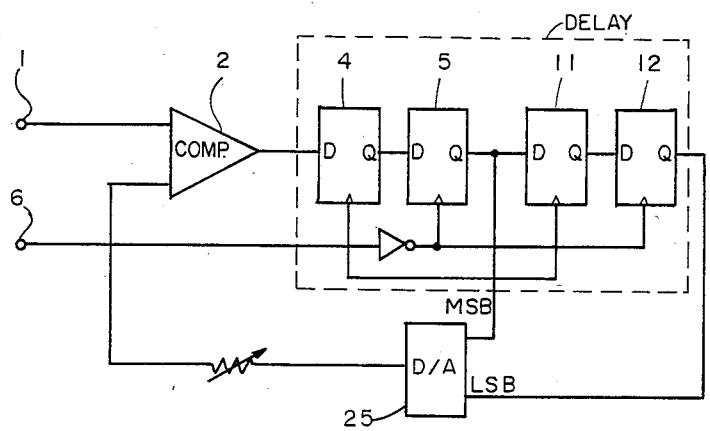
FIGS. 7 through 9 show still further embodiments of the present invention.
Figure 8:
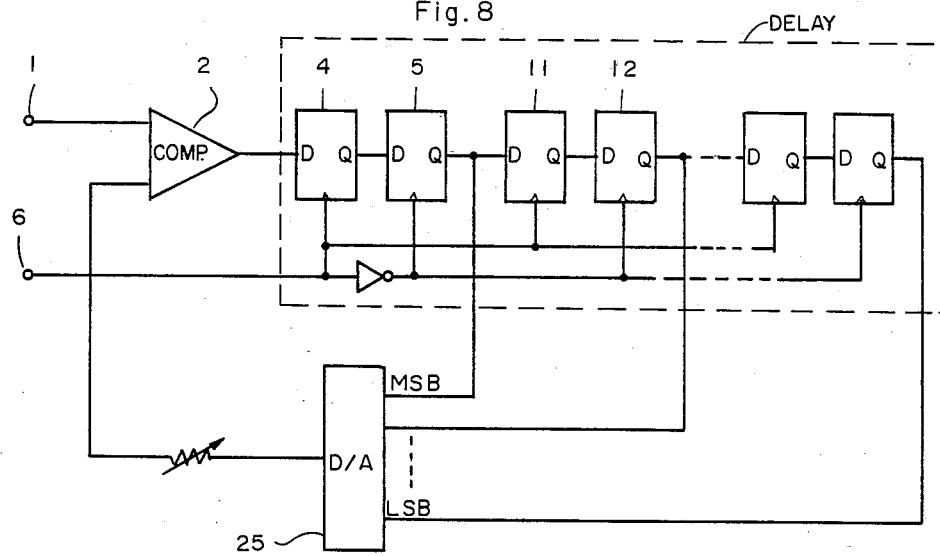

Instead of the operational circuit which is a combination of gates, a D/A converter 25 may be employed as shown in FIG. 7 to obtain the threshold information from the information in the two preceding bit cells. 2n units of flip-flops may also be cascade-connected, as shown in FIG. 8, in such a manner that n units of outputs are inputted to the n-bit D/A converter 25, whose analog output is applied to the threshold input of the comparator 2.

Figure 9:
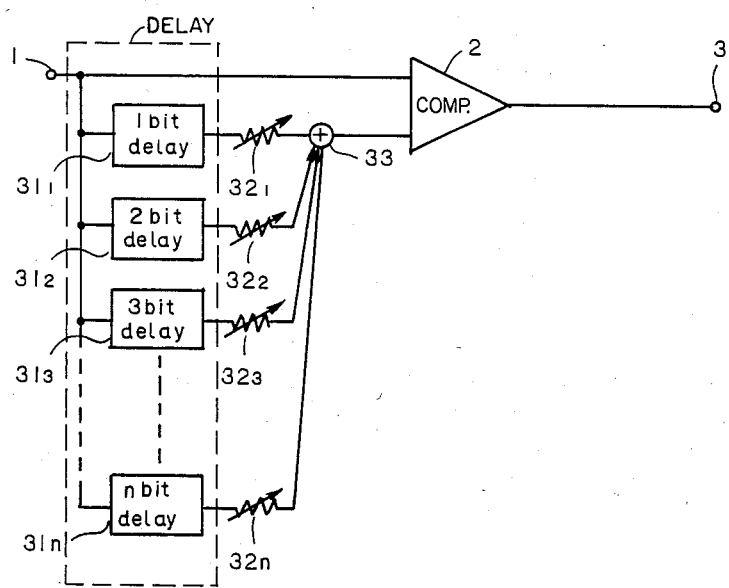

As shown in FIG. 9, digital signals parallel to one another may be applied to delay circuits $31_1$, $31_2$,—$31_n$ whose delay times are 1-bit-cell, 2-bit-cell,—n-bit-cell, respectively. Their outputs are level adjusted by means of variable resistors $32_1$, $32_2$,—$32_n$, added by means of an adder 33, and then applied to the threshold input of the comparator 2. The delay circuit may also be of the type in which the so-called CR integration circuit provided by resistors and capacitors, is used.

Figure 10:
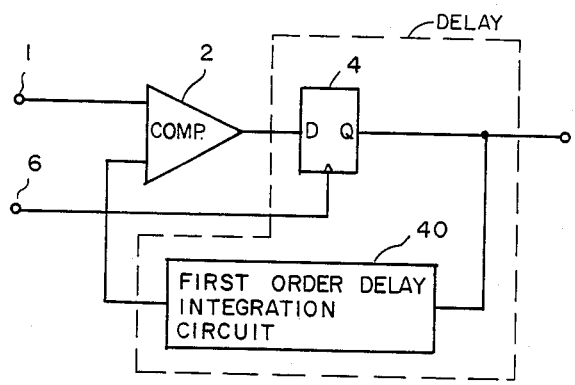
FIG. 10 is a block diagram of another embodiment of the present invention.
Figure 11:
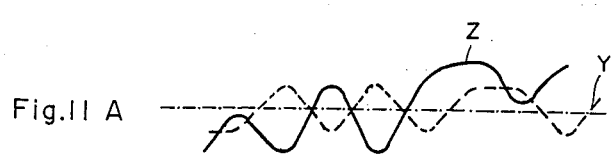
FIGS. 11A to 11E are waveform diagrams by which the operation of the embodiment shown in FIG. 10 is explained.
Figure 11:
Figure 11:
Figure 11:
Figure 11:

FIG. 10 shows a circuit in which the output of a comparator 2 is latched by a D flip-flop 4 and passed through a first order delay integration circuit 40 to build a threshold level assigned to the comparator 2. The relation between a then input signal and a varying threshold level is shown by Z and Y in FIG. 11A. Even data so deteriorated not to be detected at a constant threshold level shown by the dot and dash line of FIG. 11A can be correctly detected with a varying threshold level Y. Past digital data may be transformed to be used as the varying threshold level.

The demodulaton process is shown in FIGS. 11A-11E. In FIG. 11A, Z represents the deteriorated input signal and Y the varying threshold level built through the first order delay integration circuit 40. FIG. 11B shows a clock signal adapted to rise in the center of data, synchronizing with a bit cell applied to a terminal 6. FIG. 11C shows a signal whose waveform has been shaped by the comparator 2. FIG. 11D shows the signal in FIG. 11C latched by the D flip-flop 4 at the rise of said clock signal shown in FIG. 11B. FIG. 11E shows the signal in FIG. 11D integrated by the first order delay integration circuit 40, said integrated signal being applied to the comparator 2 as its threshold terminal level. In short, the signal shown in FIG. 11E is delayed 1 bit as compared with the input signal Z.

Figure 12:
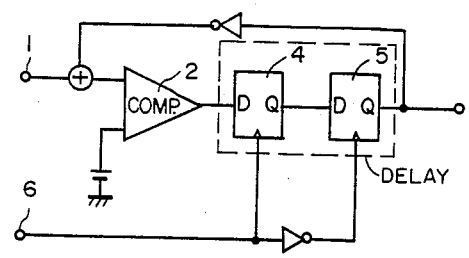
FIG. 12 is a block diagram of another embodiment of the present invention.

Although the threshold level relative to the input signal has been made variable by past digital data in the above-described case, 1-bit-preceding data may be inverted and added to the input signal, as shown in FIG. 12.

The embodiments described above referring to FIGS. 1A to 12 have the feature that the relative relation between the input signal and the threshold level of the comparator is changed in accordance with the level of past data. Further embodiments having the same feature as above will be described with reference to FIGS. 13 to 17.

Figure 13:
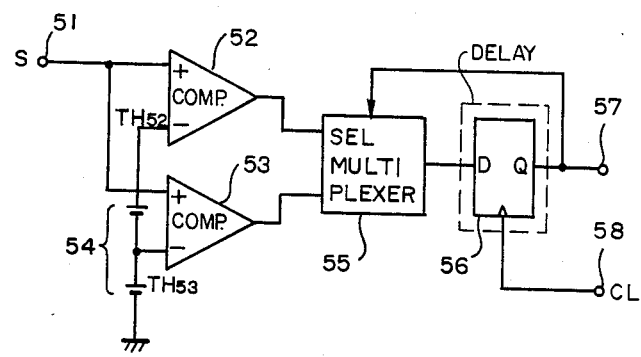
FIG. 13 is a block diagram of a still enother embodiment of the present invention.

FIG. 13 shows the arrangement of another embodiment according to the present invention. In FIG. 13, numeral 51 represents an input terminal to which analog-like digital signal S of FIG. 14 and reproduced from a recording medium such as a magnetic tape is applied, 52 and 53 first and second comparators, 54 reference voltage sources for supplying first and second threshold levels $TH_{52}$ and $TH_{53}$ ($TH_{52} > TH_{53}$) to the first and second comparators 52 and 53, as comparison reference voltages, 55 a multiplexer for alternatively switching outputs of said first and second comparators, 56 a D flip-flop for temporarily latching the output of said multiplexer 55 and applying the output, as a selecting signal, to a terminal SEL so as to cause the multiplexer 55 to select outputs of said first and second comparators 52 and 53, 57 an output terminal for outputting the output of said D flip-flop 56 as a final output, and 58 a clock signal input terminal for inputting clock signal CL to the D flip-flop 56 to thereby determine the timing of said D flip-flop 56.

FIGS. 14A through 14E are waveform diagrams obtained when the embodiment shown in FIG. 13 is rendered operative.

FIG. 14A illustrates input signal S and the relation between this waveform and threshold levels $TH_{52}$ and $TH_{53}$ of said first and second comparators 52 and 53.

FIG. 14B shows the waveform of clock signal CL applied to the clock signal input terminal 58. This clock signal CL is synchronized with each of the bit cells of digital information included in the input signal S and rises in the center of the each of bit cells. (Any of those clock signals which rise and fall at a predetermined phase such as in the center of each of the bit cells could achieve the same function). FIGS. 14C and 14D show outputs of said first and second comparators 52 and 53, respectively, and FIG. 14E is a waveform diagram showing the output signal of said D flip-flop.

When input signal S reproduced from a recording medium and shown in FIG. 14A is applied to the input terminal 51, signals shown in FIGS. 14C and 14D are outputted from the comparators 52 and 53, respectively, since threshold levels $TH_{52}$ and $TH_{53}$ assigned to the first and second comparators 52 and 53 are different from each other ($TH_{52} > TH_{53}$). Using the signal fed back from the output terminal Q of said D flip-flop 56, that is, using the immediately preceding bit decision value as a selecting signal, the multiplexer 55 selects the output of said second comparator 53 when the selecting signal is "0" and the output of said first comparator 52 when "1", to apply one of them to the input terminal D of said D flip-flop 56. This signal applied to the D flip-flop 56 is latched when clock signal CL applied to the clock signal input terminal 58 rises, and this latched value is outputted to the output terminal 57 and fed back to the multiplexer 55 and held there until the next clock signal CL rises.

Since the output of the first comparator 52 is "0" as shown in FIG. 14C at a time $t=t_0$ shown in FIG. 14B, the multiplexer 55 is selecting the second comparator 53 and the signal shown in FIG. 14D is thus inputted to the D flip-flop 56. When clock signal CL rises at a time $t=t_1$, the D flip-flop 56 latches and outputs the then output $d_1 =$ "1" of the second comparator 53 (FIG. 14D). Since the output is "1" after the time $t=t_1$, the multiplexer 55 selects the output of said first comparator 52. At a time $t=t_2$, therefore, the D flip-flop 56 latches and outputs the output $c_2 =$ "0" of said first comparator 52 (FIG. 14C). Namely, when the preceding data is "0", the output of the comparator 53 having a lower threshold level is selected, and when the preceding data is "1", the output of the comparator 52 having a higher threshold level is selected, thereby providing the correct digital data.

Similarly, $d_3$, $c_4$, $d_5$, $c_6$,—shown in FIGS. 14C and 14D are successively latched by the D flip-flop 56 and a correct waveform is extracted (or shaped) as shown in FIG. 14E whereby a signal corresponding to the original digital signal is outputted through the output terminal 57.

In this case, however, threshold level $TH_{52}$ of the first comparator 52 is lower than the level of input signal S at a time when the original digital signal is "1" over more than two successive bits, while threshold level $TH_{53}$ of said second comparator 53 is higher than the level of input signal S at a time when the original digital signal is "0" over more than two successive bits.

When the waveform of input signal S is severely deteriorated the number of threshold levels and comparators is increased and the interval between threshold levels is arranged more closely, so that extraction and reproduction of the correct digital signal may be achieved.

FIG. 15 shows the arrangement of a further embodiment according to the present invention wherein three comparators are used to extract correct digital signal even when waveform deterioration is remarkable.

In FIG. 15, numeral 61 represents an input terminal to which input signal S is applied, 62, 63 and 64 first, second and third comparators, 65 reference voltage sources for supplying different threshold levels $TH_{62}$, $TH_{63}$ and $TH_{64}$ ($TH_{62}>TH_{65}>TH_{64}$) to the first, second and third comparators 62, 63 and 64, respectively, 66, 67 and 68 D flip-flops, 69 a multiplexer for alternatively selecting and outputting outputs of said first, second and third comparators 62, 63 and 64, 70 an output terminal through which the final output is outputted, and 71 a clock signal input terminal to which clock signal CL to be applied to the D flip-flops 66–68 is inputted. In this case, outputs of said first and third comparators 62 and 64 are applied to the D flip-flops 66 and 67, respectively, while the output of said multiplexer 69 is applied to the D flip-flop 68, and the output of said D flip-flop 68 is fed through the output terminal 70. Outputs of said D flip-flops 66 and 67 are applied, as selecting signals, to the multiplexer 69, which selects the output of said first comparator 62 when each of outputs of said D flip-flops 66 and 67 is "1", the output of said third comparator 64 when they are "0", and the output of said second comparator 63 when the output of the one (D flip-flop 66) is "0" but the output of the other (D flip-flop 67) is "1".

FIGS. 16A through 16I are waveform diagrams obtained when the embodiment shown in FIG. 15 is made operative.

FIG. 16A shows of input signal S and the relation between this waveform and threshold levels $TH_{62}$, $TH_{65}$ and $TH_{64}$ of said first, second and third comparators 66–64. FIG. 16B shows clock signal CL, FIGS. 16C, 16D and 16E outputs of said first, second and third comparators 62–64, respectively, FIG. 16F the output of said D flip-flop 66 which has latched the output of said first comparator 62, FIG. 16G the output of said D flip-flop 67 which has latched the output of said third comparator 64, FIG. 16H the output of said multiplexer 69 and FIG. 16I the final output waveform.

Input signal S whose waveform has deteriorated is compared with threshold levels $TH_{62}$–$TH_{64}$ and the result thus obtained is selected to achieve waveform shaping. When input signal S is lower than threshold level $TH_{64}$ at the time of bit decision, the output of third comparator 64 of threshold level $TH_{64}$ is selected by the multiplexer 69, latched by the D flip-flop 68 and then applied to the output terminal 70 at the next bit decision. When input signal S is higher than threshold level $TH_{62}$ at the time of bit decision, the output of first comparator 62 of threshold level $TH_{62}$ is selected by the multiplexer 69 and latched by the D flip-flop 68 to be applied as the output at the next bit decision. Except for these cases and when input signal S is lower than threshold level $TH_{62}$ but higher than threshold level $TH_{64}$ at the time of bit decision, the output of said second comparator 63 is selected at the next bit decision.

Table 2 shows the relation between input signal S and threshold levels $TH_{62}$–$TH_{64}$ at the time of bit decision, and the relation between then outputs of said first through third comparators 62–64 and the comparator selected at the next time of bit decision.

TABLE 2

| Relation between input signal and threshold levels | Comparator output | | | Comparator selected at the next time of bit decision |
|---|---|---|---|---|
| | 62 | 63 | 64 | |
| $S > TH_{62}$ | 1 | 1 | 1 | 62 |
| $TH_{64} < S < TH_{62}$ | 0 | 0 or 1 | 1 | 63 |
| $TH_{64} > S$ | 0 | 0 | 0 | 64 |

Input signal S reproduced from the recording medium is applied to the input terminal 61. Each of outputs of the first, second and third comparators 62–64 is "0" when $t=t_0$. The multiplexer 69 therefore selects the third comparator 64. The output of the third comparator 64 changes from "0" to "1", when $t_0<t<t_1$. This output "1" is latched by the D flip-flop 68 to be outputted through the output terminal 70 while being latched by the D flip-flop 67 when $t=t_1$. At the same time the output of the D flip-flop 66 by which the output of the first comparator 62 has been latched is "0". The multiplexer 69 is thus switched over by the output of the D flip-flop 67 to select the output of the second comparator 63. Therefore, the output of the multiplexer 69 becomes "0" when $t=t_1$, since input signal S is lower than threshold level $TH_{63}$. Since the output of the second comparator 63 is "0" when $t=t_2$, it is latched by the D flip-flop 68. As outputs of the D flip-flops 66 and 67 become "0", respectively the multiplexer 69 selects the output of the third comparator 64 again. The output of the third comparator 64 changes from "0" to "1" when $t_2<t<t_3$ and is latched by the D flip-flop 68 to be outputted through the output terminal 70 while being latched by the D flip-flop 67 when $t=t_3$. The output of the first comparator 62 which is latched by the D flip-flop 66 at the same time is "0". Accordingly, the multiplexer 69 selects the second comparator 63 as already described above. The output of the second comparator 63 changes from "1" to "0" when $t_3<t<t_4$ and the input of the D flip-flop 68 is "0" even when $t=t_4$. Output through the output terminal 70 therefore becomes "0".

Similar operation will be hereafter repeated. Selection by the multiplexer 69 is determined, as shown in Table 3, by the outputs of the D flip-flops 66 and 67 which have latched the condition of immediately preceding bits at the time of bit decision.

TABLE 3

| D flip-flop outputs | | Comparator selected |
|---|---|---|
| 66 | 67 | |
| 0 | 0 | 64 |
| 0 | 1 | 63 |
| 1 | 1 | 62 |

Accordingly, when the preceding data is lower than the threshold level of the comparator 64, the output of the comparator 64 is selected, and when the preceding data is higher than the threshold level of the comparator 62, the output of the comparator 62 is selected, and when the preceding data is between the threshold levels of the comparators 64 and 62, the output of the comparator 63 is selected.

The output as shown in FIG. 16I can be thus obtained through the output terminal 70.

It should be understood that the present invention is not limited to the embodiments described above and shown in the drawings but can be variously modified without departing from the spirit and scope of the present invention.

Figure 17:
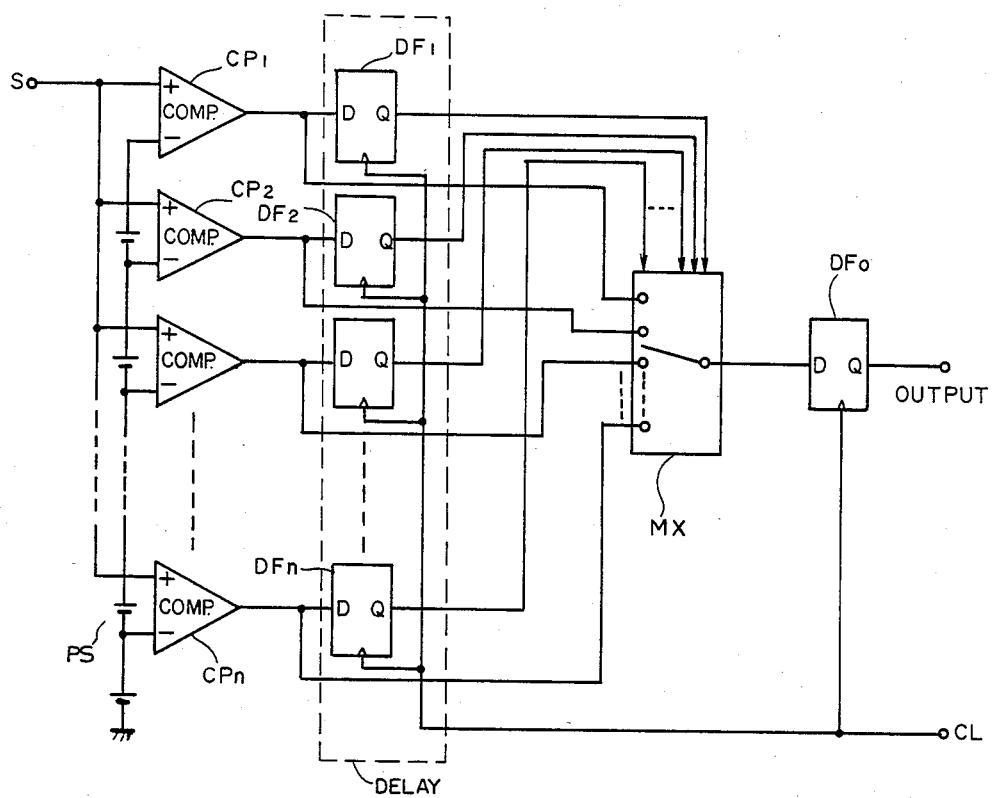
FIG. 17 is a block diagram of a still further embodiment of the present invention.

Although the above embodiments have been described using two and three comparators, that is, two and three threshold levels, more accurate digital signal extraction may be achieved even when the waveform deterioration of input signal is severe using a plurality of comparators $CP_1$-$CP_n$ to which different threshold levels have been assigned, respectively, from reference voltage sources PS as shown in FIG. 17. Outputs at the time of immediately preceding bit decision are latched by D flip-flops $DF_1$-$DF_n$ and a multiplexer MX switched over according to their latched condition so as to select one of the outputs of the comparators $CP_1$-$CP_n$ and to apply it to a D flip-flop $DF_0$.

Although selection and switchover of comparators whose threshold levels are different have been achieved responsive to the output condition of each of the comparators at the bit decision time of the immediately preceding bit in the above-described embodiments, the comparator for use in bit decision may be selected responsive to the output condition of each of the comparators at the bit decision time of immediately preceding plural bits.

As described above, the present invention provides the digital signal waveform shaping circuit in which the relative value between the input signal to be demodulated and the threshold level can be varied in accordance with the preceding one or plural bit data.

The present invention allows the threshold level of the comparator to be controlled using preceded data. According to the present invention, therefore, there can be provided a digital data demodulator circuit capable of accurately demodulating even those data whose peak levels are higher or lower than the prescribed level, whose properties have deteriorated, and which have been time shifted.

Further the present invention causes the input signal to be applied to a plurality of comparators whose threshold levels are different, one of the plural comparators is selected responsive to the output condition of each of the comparators at the bit decision time of immediately preceding bit, and the bit is decided to be either "1" or "0" by the output of said selected comparator. Accordingly, the present invention can provide a digital signal extraction system capable of accurately extracting and reproducing an original digital signal from an input signal whose waveform has been deteriorated through the transmission line including the recording and reproducing system.

What is claimed is:

1. In a device for reproducing a digital signal recorded on a recording medium, a digital signal waveform shaping circuit comprising, at least one comparator having a first input for receiving an input signal corresponding to said digital signal and a second input for receiving a threshold level signal, a delay circuit comprising at least one pair of cascade connected flip-flops, an input to the first flip-flop of said at least one pair of flip-flops being connected to the output of said at least one comparator, the second input of said comparator being responsive to the output of the second flip-flop of said at least one pair of flip-flops, synchronizing signal means for producing synchronizing signals to clock said first and second flip-flops of said at least one pair of flip-flops, first means for applying said synchronizing signals to the clock input of said first flip-flop and second means for applying inverted synchronizing signals to the clock input of said second flip-flop.

2. The digital signal waveform shaping circuit according to claim 1, wherein the output of said comparator is connected to the waveform shaping circuit output terminal.

3. The digital signal waveform shaping circuit according to claim 1, wherein said delay circuit comprises a plurality of pairs of cascade connected flip-flops, said waveform shaping circuit further including decoder means responsive to the outputs of the second flip-flop of each pair of cascade connected flip-flops, a plurality of threshold level voltage sources, and selector means for selectively connecting said threshold level voltage sources to said comparator threshold level signal input terminal in response to the output of said decoder means.

4. The digital signal waveform shaping circuit according to claim 3, wherein said decoder means comprises an n-bit decoder, and said selector means selects $2^n$ threshold voltages.

5. The digital signal waveform shaping circuit according to claim 1, wherein said delay circuit comprises a plurality of pairs of cascade connected flip-flops, said waveform shaping circuit further comprising a digital-to-analog converter means, responsive to the outputs of the second flip-flops of each pair of cascade connected flip-flops, the threshold level signal input of said comparator being responsive to the output of said digital-to-analog converter means.

6. A digital signal waveform shaping circuit comprising, at least one comparator, a delay circuit, and means for applying an input signal corresponding to said digital signal to a first input of said comparator and to the input of said delay circuit, the output of said delay circuit being connected to a second input of said comparator, said delay circuit comprising a plurality of bit delay means each connected to the delay circuit input for receiving the input signal and each delaying an input bit thereto by one bit cell more than its immediately preceding bit delay means, the delay circuit further comprising an adder circuit responsive to the outputs of said plurality of bit delay means.

7. In a device for reproducing a digital signal recorded on a recording medium, a digital signal waveform shaping circuit comprising, at least one comparator having a first input for receiving an input signal corresponding to said digital signal and a second input for receiving a threshold level signal, and delay means comprising a flip-flop responsive to the output of said comparator and an integrator means for integrating the flip-flop output, the output of the integrator means being connected to the threshold level signal input of said comparator.

8. In a device for reproducing a digital signal recorded on a recording medium, a digital signal waveform shaping circuit comprising, at least one comparator having a first input for receiving an input signal corresponding to said digital signal and a second input for receiving a threshold level signal, at least one pair of cascade connected flip-flops, an input to the first flip-flop of said at least one pair of flip-flops being connected to the output of said comparator, the output of the second flip-flop of the at least one pair of flip-flops being connected through an inverter to the input of said comparator receiving said input signal, said threshold level signal receiving input of said comparator being connected to a fixed threshold level signal source.

9. A digital signal waveform shaping circuit comprising a first comparator receiving a higher threshold level, a second comparator receiving a lower threshold level and a third comparator receiving a threshold level between said higher and lower levels, one input of the respective comparators receiving an input signal corresponding to said digital signal, a frist delay circuit connected to the output of said first comparator, a second delay circuit connected to the output of said second comparator, a selector means for selecting one of the outputs of the comparators based on the preceding data delivered from said first and second delay circuits, and a flip-flop connected to the output of said selector means.

10. The digital signal waveform shaping circuit according to claim 9, wherein the outputs of the plural comparators are selected in accordance with the preceding data transmitted from the delay circuits respectively connected to said comparators.

* * * * *